United States Patent [19]

Ohkawa

[11] Patent Number: 4,852,058
[45] Date of Patent: Jul. 25, 1989

[54] SEMICONDUCTOR MEMORY CIRCUIT HAVING INSPECTION CIRCUIT

[75] Inventor: Takashi Ohkawa, Yokohama, Japan
[73] Assignee: Fujitsu Limited, Kawasaki, Japan
[21] Appl. No.: 947,336
[22] Filed: Dec. 29, 1986
[30] Foreign Application Priority Data
 Dec. 27, 1985 [JP] Japan .................. 60-299300
[51] Int. Cl.[4] .................. G11C 7/00; G11C 17/00; G11C 17/06
[52] U.S. Cl. .................. 365/94; 365/105; 365/201
[58] Field of Search .................. 365/94, 96, 105, 189, 365/243, 201; 371/21

[56] References Cited
U.S. PATENT DOCUMENTS

| | | | |
|---|---|---|---|
| 4,276,617 | 6/1981 | Le | 365/94 X |
| 4,319,341 | 3/1982 | Fukushima et al. | 365/94 |
| 4,385,368 | 5/1983 | Principi et al. | 365/105 |
| 4,459,694 | 7/1984 | Ueno et al. | 365/201 X |
| 4,639,895 | 1/1987 | Iwahashi et al. | 365/200 |

Primary Examiner—Stuart N. Hecker
Assistant Examiner—Alyssa H. Bowler
Attorney, Agent, or Firm—Armstrong, Nikaido, Marmelstein, Kubovcik & Murray

[57] ABSTRACT

A semiconductor memory circuit includes a plurality of programmable memory cells capable of being programmed by a predetermined current; a plurality of bit lines connected with memory cells, a plurality of current distributors corresponding to the bit lines for connecting selected bit lines to an output terminal based on selection signals and separating non-selected bit lines from the output terminal, and a plurality of switching circuits corresponding to the bit lines for connecting non-selected bit lines to a low level potential point based on the selection signals. The determination of the existence of the inter-cell leakage is carried out precisely and easily.

3 Claims, 5 Drawing Sheets

Fig. 2
Fig. 2A
Fig. 2B

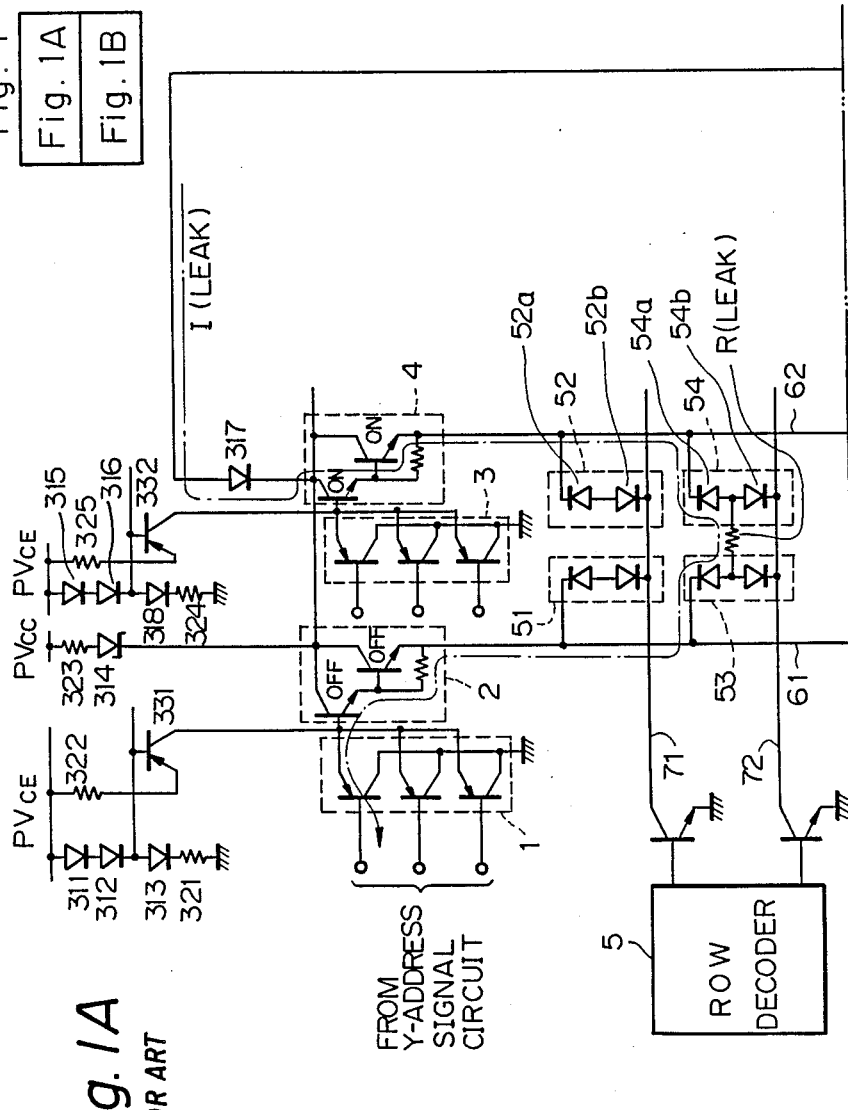

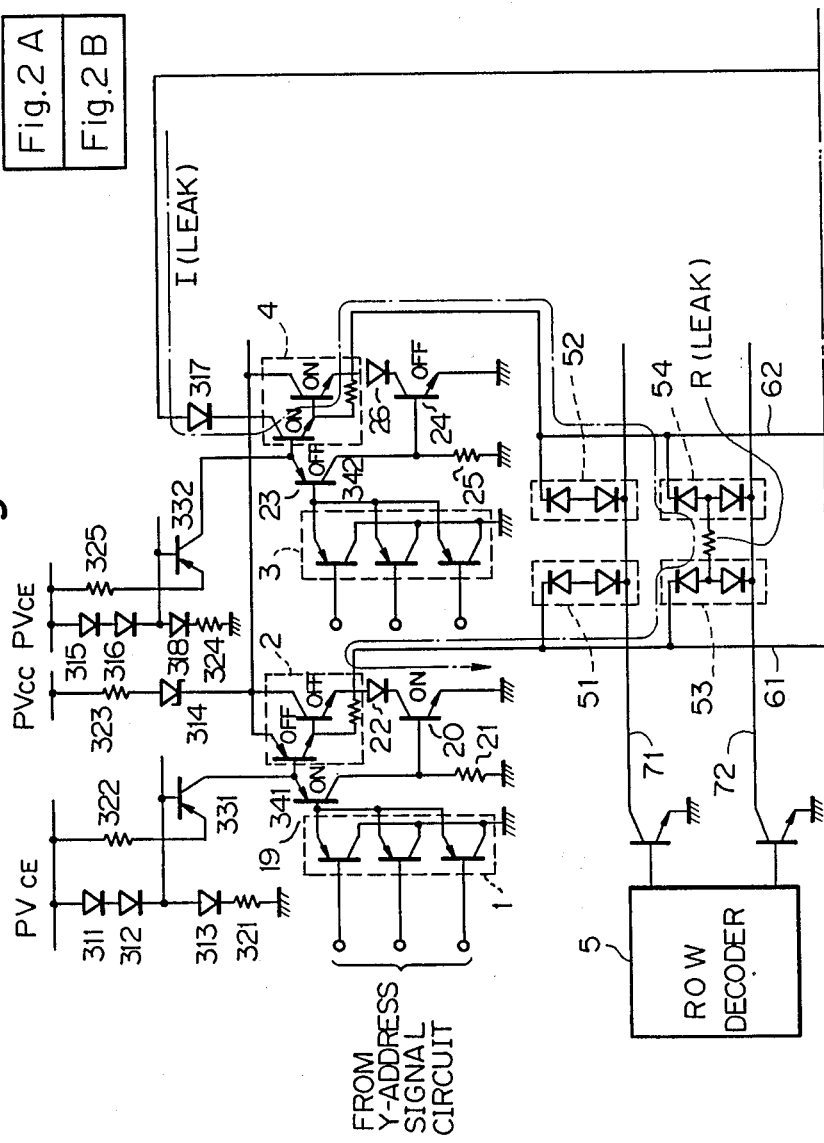

SEMICONDUCTOR MEMORY CIRCUIT HAVING INSPECTION CIRCUIT

BACKGROUND OF THE INVENTION

1. Field of the Invention

The present invention relates to a semiconductor memory circuit having an inspection circuit. The circuit according to the present invention is applicable to a programmable read only memory (PROM).

2. Description of the Related Arts

In the production of PROMs, sometimes portions of a polycrystalline silicon isolation layer between adjacent memory cells are defective because of a break or minute dust particles, so that an electrical leakage occurs between the adjacent memory cells. In a PROM circuit having an electrical leakage, a write operation for programming becomes impossible, and thus the PROM circuit in question is a defective product. Accordingly, an inspection must be carried out to detect the existence of a electrical leakage in produced PROMs before supplying the PROMs to users, to exclude faulty products. Therefore, an inspection arrangement is provided in PROMs being produced.

In a prior art, the inspection of the memory cell is carried out by detecting: a leakage current passing through an output terminal; a current distributor in an ON state; a diode of a memory cell; a leakage resistance between memory cells; another diode of the memory cell; another current distributor in an OFF state; and, a LOW level input terminal of a decoder circuit.

But, because of the voltage drop in transistors in an OFF state in the current distributor due to the base/emitter reverse withstanding voltage of these transistors, and the voltage drop in the base bias resistor in the current distributor, the value of the leakage current is extremely small, and therefore, it is probable that the leakage current cannot be detected, or a discrimination of whether or not the current is caused by a leakage cannot be carried out. In such a situation, the desired inspection of the semiconductor memory circuit cannot be carried out precisely and easily.

SUMMARY OF THE INVENTION

It is an object of the present invention to provide an improved semiconductor memory circuit in which the inspection of the semiconductor memory circuit with memory cells is carried out precisely and easily.

In accordance with the present invention, there is provided a semiconductor memory circuit including: a plurality of programmable memory cells capable of being programmed by a predetermined current; a plurality of bit lines connected with memory cells; a plurality of current distributors correpsonding to the plurality of bit lines for connecting selected bit lines to an output terminal based on selection signals and separating non-selected bit lines from the output terminal; and a plurality of switching circuits corresponding to the plurality of bit lines for connecting non-selected bit lines to a point having a low level potential based on the selection signals.

BRIEF DESCSRIPTION OF THE DRAWINGS

In the drawings, FIGS. 1A and 1B are a schematic diagram of a prior art semiconductor memory circuit of the PROM type;

FIGS. 2A and 2B are a schematic diagram of a semiconductor memory circuit according to an embodiment of the present invention; and FIG. 3 is a cross-sectional view of the structure of a PROM circuit including two adjacent memory cells.

DESCRIPTION OF THE PREFERRED EMBODIMENTS

Before describing a preferred embodiment of the present invention, a prior art semiconductor memory circuit of the PROM type is described with reference to FIG. 1.

Figure 1B:
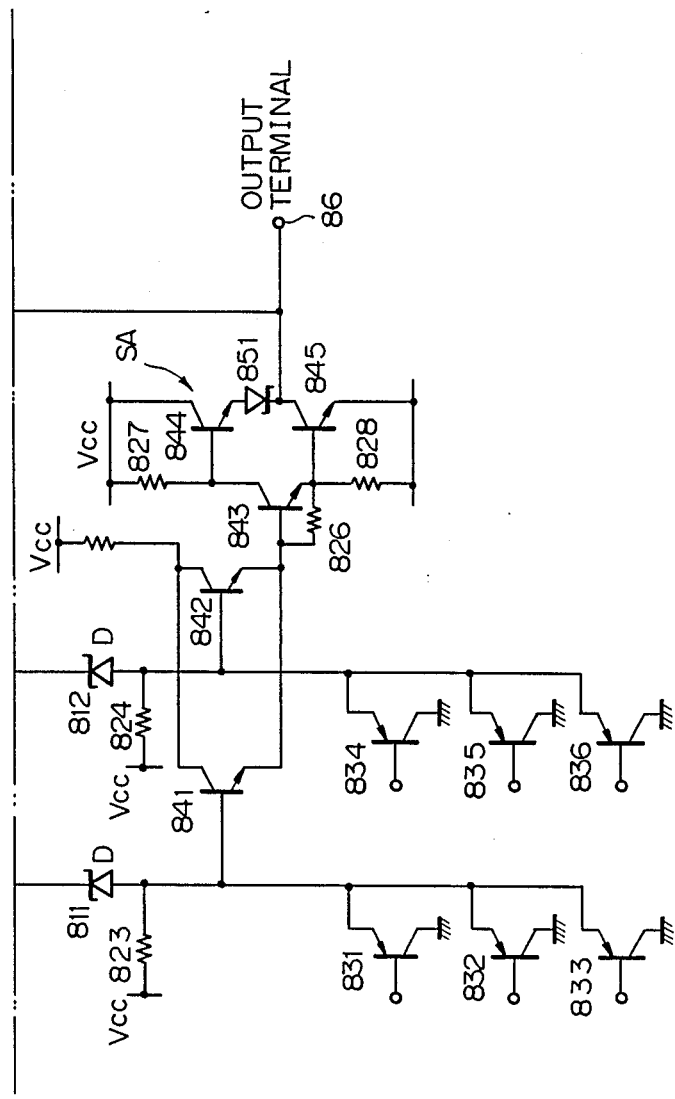

The circuit of FIG. 1 includes, decoder circuits 1 and 3; current distributors 2 and 4; memory cells 51, 52, 53, and 54; bit lines 61 and 62; and, word lines 71 and 72.

The current distributors 2 and 4 supply current to the bit lines 9 and 10 when the current distributors 2 and 4 are selected by operation of the decoder circuits 1 and 3. Each of the memory cells 51, 52, 53, and 54 consists of two series-connected diodes having opposite polarities. The word lines 71 and 72 can be selected by row decoder circuits 5.

The power source circuits of the voltages $PV_{CE}$ and $PV_{CC}$ include diodes 311, 312, 313, and 314, resistors 321, 322, 323, 324, and 325, and transistors 331 and 332.

Each of the decoder circuits 1 and 3 includes parallel-connected transistors, and each of the current distributors 2 and 4 includes cascade-connected transistors and a base bias resistor.

Schottky diodes 811 and 812 are connected to the bit lines 61 and 62, and a decoder circuit consisting of transistors 831, 832, and 833 is connected between one electrode of the Schottky diode 811 and ground, and a decoder circuit consisting of transistors 834, 835, and 836 is connected between one electrode of the Schottky diode 812 and ground.

Parallel-connected transistors 841 and 842 are provided, and the gates of the transistors 841 and 842 are connected to one electrode of the Schottky diodes 811 and 812. A sense amplifier SA is connected between the emitters of the transistors 841 and 842 and an output terminal 86. The sense amplifier SA includes transistors 843, 844, and 845, resistors 826, 827, and 828, and a diode 851.

The output terminal 86 is connected to one electrode of a diode 317, and the other terminal of the diode 317 is connected to the collectors of the transistors in the current distributors 2 and 4.

In the write operation, assuming that the memory cell 52 will be written by destroying the diode 52a, the output of the decoder 3 becomes HIGH so that the current distributor 4 is turned ON, and the word line 71 becomes LOW level, whereas the word line 72 becomes HIGH level. On this condition, a write current of about 120 mA is applied to the output terminal 86 so that the write current flows from the output terminal 86 - bit line 62 - diode 52a - diode 52b - word line 71, and accordingly, the reverse biased diode 522 is destroyed.

However, if there is a breakdown between the memory cell's 53 and 54, and if the write operation to the cell 52 is performed after destroying the diode 54a in the memory cell 54, the write current from the output terminal 86 flows to the bit line 62 - destroyed diode 54a - cell 53 - bit line 61 - current distributor 2 - low level input terminal of the decoder circuit 1. In such a worst case, the write current can not flow to the memory cell 52 which should be subject to a write operation. Therefore, such a leak path between memory cells should be detected in an inspection.

An example of the conventional inspecting operation of the circuit of FIG. 1 will be described. In the following description, it is assumed that $PV_{CE}$ is 20 volts, $PV_{CC}$ is 7 volts, the output terminal voltage V(86) is 20 volts, and the word line voltages V(71), V(72) are about 20 volts.

Assuming that all of the potentials of the input signals to the decoder circuit 3 are HIGH, and at least one input signal to the decoder 1 is LOW. In this case the outputs of the decoder circuit 1 become LOW so that the transistors of the current distributor 2 are turned OFF. The potential of the output of the decoder circuit 3 then becomes HIGH, and thus the transistors of the current distributor 4 are turned ON.

It is assumed that there is no leakage between the memory cells 51 and 52, but that a leakage exists between the memory cells 53 and 54. Since all word lines 71, 72 are HIGH level, if there is a leakage R(LEAK) between the memory cells 53 and 54, a leakage current I(LEAK) passes through the output terminal 86, the current distributor 4 in an ON state, the upper diode 54a of the memory cell 54, the leakage resistance R(LEAK) between the memory cells 53 and 54, the upper diode of the memory cell 53, the current distributor 2 in an OFF state, and the LOW level input terminal of the decoder circuit 1.

In this manner, the inspection of the semiconductor memory circuit of FIG. 1 is carried out for each of the bit lines. When a leakage current is detected in any of the bit lines by such an inspection, it is acknowledged that there is a failure in the insulation between adjacent memory cells, and accordingly, the PROM circuit exhibiting such an insulation failure must be rejected as a defective product.

Nevertheless, because of the voltage drop in the transistors in the OFF state in the current distributor 2 due to the base/emitter reverse withstanding voltage of these transistors and the voltage drop in the base bias resistor in the current distributor 2, the value of the leakage current I(LEAK) is extremely small, for example, several µA to several tens µA, and thus, it is probable that the leakage current I(LEAK) cannot be detected, or the discrimination of whether or not the current is caused by a leakage cannot be carried out. In such a situation, the desired inspection of the semiconductor memory circuit cannot be carried out precisely and easily.

Figure 2B:
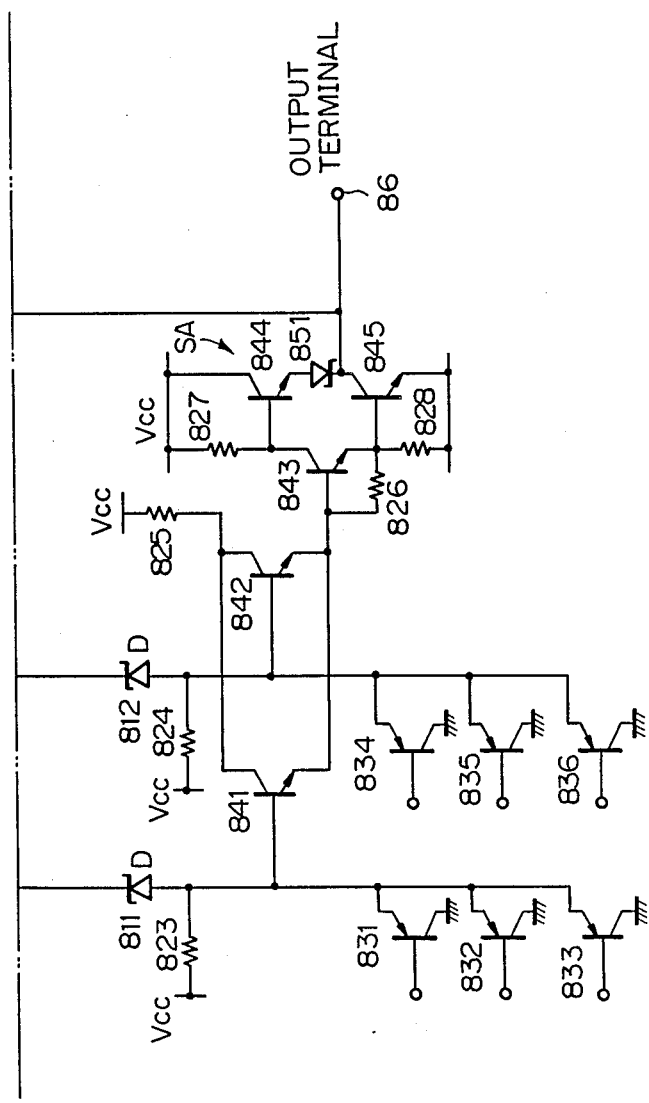

A semiconductor memory circuit according to an embodiment of the present invention is shown in FIG. 2. The semiconductor memory circuit shown in FIG. 2 is a bipolar PROM type. The circuit of FIG. 2 includes decoder circuits 1 and 3, current distributors 2 and 4, memory cells 51, 52, 53, and 54, bit lines 61 and 62, and word lines 71 and 72.

The current distributors 2 and 4 supply current to the bit lines 9 and 10 when the current distributors 2 and 4 are selected by the operation of the decoder circuits 1 and 3. Each of the memory cells 51, 52, 53, and 54 consists of two series-connected diodes having opposite polarities. The word lines 71 and 72 can be selected by row decoder circuits 5.

The power source circuits of the voltages $PV_{CE}$ and $PV_{CC}$ include diodes 311, 312, 313, and 314, resistors 321, 322, 323, 324, and 325, and transistors 331 and 332.

Each of the decoder circuits 1 and 3 includes parallel-connected transistors, and each of the current distributors 2 and 4 includes cascade-connected transistors and a base bias resistor. Transistors 341 and 342 are inserted between the decoder circuit 1 and the current distributor 2 and between the decoder circuit 3 and the current distributor 4. The base of the transistor 341 is connected to the emitters of the transistors in the decoder circuit 1, and the emitter of the transistor 341 is connected to the base of one of the transistors in the current distributor 2. A series-connected diode 22 and transistor 20 are connected between one terminal of the current distributor 2 and ground. The transistor 20 may be an ordinary transistor or a transistor with a Schottky diode. The collector of the transistor 341 is connected to one terminal of a resistor 21 having the other terminal grounded. The base of the transistor 20 is connected to the collector of the transistor 341.

The base of the transistor 342 is connected to the emitters of the transistors in the decoder circuit 3, and the emitter of the transistor 342 is connected to the base of one of the transistors in the current distributor 4. A series-connected diode 26 and transistor 24 are connected between one terminal of the current distributor 4 and ground. The transistor 24 may be of the Schottky type. The collector of the transistor 342 is connected to one terminal of a resistor 25 having the other terminal grounded, and the base of the transistor 24 is connected to the collector of the transistor 342.

Schottky diodes 811 and 812 are connected to the bit lines 61 and 62. A decoder circuit consisting of transistors 831, 832, and 833 is connected between one electrode of the Schottky diode 811 and ground, and a decoder circuit consisting of transistors 834, 835, and 836 is connected between one electrode of the Schottky diode 812 and ground.

Parallel-connected transistors 841 and 842 are provided, and the gates of the transistors 841 and 842 are connected to one electrode of the Schottky diodes 811 and 812. A sense amplifier SA is connected between the emitters of the transistors 841 and 842 and an output terminal 86. The sense amplifier SA includes transistors 843, 844, and 845, resistors 826, 827, and 828, and a diode 851.

The output terminal 86 is connected to one electrode of a diode 317, and the other terminal of the diode 317 is connected to the collectors of the transistors in the current distributors 2 and 4.

The provision of the transistors 341, the diode 22, the transistor 20, and the resistor 21 causes the potential of the bit line 61 to be LOW when the bit line 61 is in a non-selected state. The provision of the transistor 342, the diode 26, the transistor 24, and the resistor 25 causes the potential of the bit line 62 to be LOW when the bit line 62 is in a non-selected state.

The diodes 22 and 26 operate to accelerate the switching operation of the current distributors 2 and 4 so that the currents passing through the transistors 20 and 24 are reduced, but the diodes 22 and 26 can be omitted if this operation is not needed.

An example of the inspecting operation of the circuit of FIG. 2 will be described. In the following description, it is assumed that $PV_{CE}$ is 20 volts, $PV_{CC}$ is 7 volts, the output terminal voltage V(86) is 20 volts, and the word line voltages V(71), V(72) are about 20 volts, this means that the word lines 71, 72 are HIGH level.

When the bit line 62 is brought to the selected state by causing all of the potentials of the inputs of the decoder circuit 3 to be HIGH, the transistors 23 and 24 are turned OFF and the current distributor 4 is turned ON.

At least one of the potentials of the inputs of the decoder circuit 1 is LOW, and hence the transistors 19 and 20 are turned ON so that the current distributor 2 is turned OFF.

Thus, due to a voltage applied to the output terminal 86 for detecting a leakage, a leakage current passes through the current distributor 4, the bit line 62, the upper diode of the memory cell 54, the leakage resistance R(LEAK), the upper diode of the memory cell 53, the bit line 61, the diode 22, the transistor 20, and ground.

Under such a condition, it is not necessary to pass the current through the current distributor 2 in an OFF state, and the voltage drops due to the emitter-base reverse voltage of the transistors or the base bias resistor in the current distributor 2. This makes the value of the leakage current extremely large, to facilitate the detection of the leakage. For example, a leakage current on the order of several mA flows under the applied voltage of about 20 V. Accordingly, the determination of the existence of the inter-cell leakage is carried out precisely and easily. Since the write current is almost 120 mA, which is much larger than several mA, even though the inspecting current becomes large in the present invention, there is no problem with the diodes of the memory cell.

Figure 3:
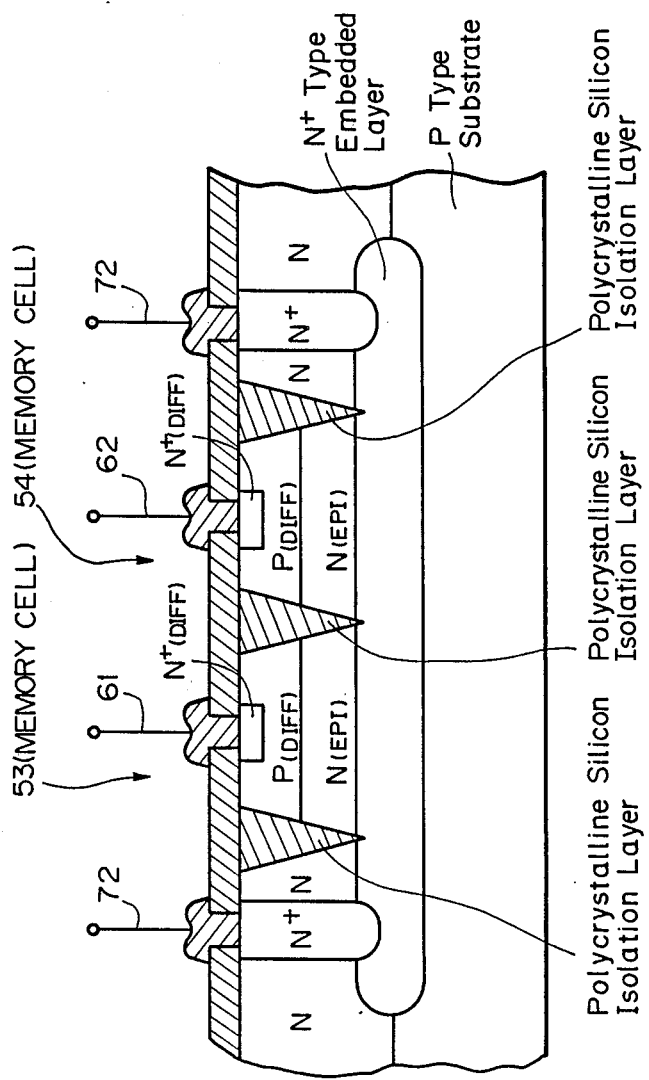

In order to explain the necessity of the semiconductor memory circuit shown in FIG. 2, the cross-sectional structure of a PROM circuit including two adjacent memory cells 53 and 54 (FIG. 2) is shown in FIG. 3. The structure includes a P type substrate, a high concentration N+ type embedded layer, an N type epitaxial layer N(EPI), a P type diffusion layer P(DIFF), and a high concentration N+ type diffusion layer N+(DIFF). The N+ type diffusion layer N+(DIFF) and the P type diffusion layer P(DIFF) constitute the upper diode of the memory cell 53, 54, while the P type diffusion layer P(DIFF) and the N type epitaxial layer N(EPI) constitute the lower diode of the memory cell 53 and 54.

Polycrystalline silicon insulation layers are provided for electrically insulating the memory cell 53 from the memory cell 54. Because of the existence of the polycrystalline silicon insulation layer, the distance between the adjacent memory cells 53 and 54 can be reduced so that a high integration of the structure of the device can be attained.

Nevertheless, sometimes portions of the polycrystalline silicon isolation layer are defective because of a break or minute dust particles, so that an electrical leakage occurs between the adjacent memory cells. In the PROM circuit having such an electrical leakage, a write operation for programming becomes impossible, and thus such a PROM circuit is defective. Accordingly, an inspection must be carried out to detect the existence of a electrical leakage in produced PROMs before supplying the PROMs to users, to exclude faulty products. This is why the semiconductor memory circuit with the inspection arrangement shown in FIG. 2 is needed.

I claim:

1. A semiconductor memory circuit comprising:
   a plurality of bit lines;
   a plurality of word lines intersecting said plurality of bit lines;
   a plurality of programmable memory cells connected to the intersections of said bit lines and said word lines, each of said memory cells having a pair of diodes connected in series with opposite polarities, said memory cells being programmable by a predetermined current flowing therethrough;
   decoder means for decoding an address signal and providing a selection signal and a non-selection signal in accordance therewith;
   a plurality of current distributor means connected between an external terminal and said plurality of bit lines and further connected to output terminals of said decoder means, said current distributor means connecting said external terminal to the corresponding selected bit line in correspondence with the selection signal and disconnecting said external terminal from the corresponding non-selected bit line in correspondence with the non-selection signal;
   word line driver means connected with said word lines for driving said word lines;
   a plurality of switching circuit means connected between said bit lines and a low level potential point and connected with output terminals of said decoder means for connecting said nonselected bit line to said low level potential point in response to the non-selection signal; and
   wherein a high level potential higher than the low level potential is applied to said external terminal and said word lines for testing said semiconductor memory circuit.

2. A semiconductor memory circuit as set forth in claim 1, wherein said each of said switching circuit means comprises:
   (a) a first switch connected between said decoder means and said current distributor means;
   (b) a second switch connected between said current distributor means and said low level potential point; and
   (c) means interconnecting said first and second switches.

3. A semiconductor memory circuit as set forth in claim 2, wherein said second switch includes a diode and a transistor connected in series, wherein said diode is connected to said current distributor means and said transistor is connected to said first switch.

* * * * *